(12) United States Patent
Fan

(10) Patent No.: US 10,147,598 B2
(45) Date of Patent: Dec. 4, 2018

(54) MANUFACTURING METHOD FOR INSULATION LAYER, MANUFACTURING METHOD FOR ARRAY SUBSTRATE AND ARRAY SUBSTRATE

(71) Applicant: Shenzhen China Star Optoelectronics Technology Co., Ltd., Shenzhen, Guangdong (CN)

(72) Inventor: Deyong Fan, Guangdong (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 15/116,497

(22) PCT Filed: Jul. 20, 2016

(86) PCT No.: PCT/CN2016/090652
§ 371 (c)(1),
(2) Date: Aug. 3, 2016

(87) PCT Pub. No.: WO2018/000484
PCT Pub. Date: Jan. 4, 2018

(65) Prior Publication Data
US 2018/0005813 A1    Jan. 4, 2018

(30) Foreign Application Priority Data

Jul. 1, 2016 (CN) .......................... 2016 1 05194356

(51) Int. Cl.
*H01L 21/31* (2006.01)
*H01L 21/02* (2006.01)
(Continued)

(52) U.S. Cl.
CPC .... *H01L 21/0226* (2013.01); *H01L 21/02348* (2013.01); *H01L 21/02422* (2013.01); *H01L 21/311* (2013.01); *H01L 27/12* (2013.01)

(58) Field of Classification Search
CPC .......... H01L 21/0226; H01L 21/02348; H01L 21/02422
See application file for complete search history.

(56) References Cited

U.S. PATENT DOCUMENTS

2002/0052069 A1   5/2002   Jiroku et al.
2002/0195642 A1   12/2002  Sandhu et al.
(Continued)

FOREIGN PATENT DOCUMENTS

CN    102819133 A    12/2012
CN    104570440 A    4/2015
(Continued)

*Primary Examiner* — Elias M Ullah

(57) ABSTRACT

A manufacturing method for insulation layer, a manufacturing method for array substrate and an array substrate are disclosed. Wherein, the manufacturing method for insulation layer comprises steps of: depositing an insulation layer on a substrate; exposing and developing the insulation layer in order to obtain the insulation layer having an opening; light curing the insulation layer having the opening; and performing a high-temperature annealing treatment to the insulation layer having the opening after being light cured. Adopting the manufacturing method for insulation layer of the present invention, a situation of deformation at the opening of the insulation layer can be reduced.

10 Claims, 2 Drawing Sheets

(51) Int. Cl.
    *H01L 21/311*     (2006.01)
    *H01L 27/12*     (2006.01)

(56) References Cited

U.S. PATENT DOCUMENTS

| | | |
|---|---|---|
| 2007/0042574 A1 | 2/2007 | Komatsu et al. |
| 2007/0159335 A1* | 7/2007 | Arai ............... G06K 19/025 340/572.8 |
| 2008/0076266 A1* | 3/2008 | Fukazawa ............ C23C 16/30 438/780 |
| 2013/0026133 A1 | 1/2013 | Engelmann et al. |
| 2013/0122686 A1 | 5/2013 | Chang et al. |
| 2014/0175467 A1* | 6/2014 | Choi ............... G02F 1/134363 257/89 |
| 2015/0053971 A1 | 2/2015 | Miyanaga et al. |

FOREIGN PATENT DOCUMENTS

| | | |
|---|---|---|
| CN | 105552131 A | 5/2016 |
| CN | 106129062 A | 11/2016 |
| JP | 19940029411 A | 2/1994 |

\* cited by examiner

MANUFACTURING METHOD FOR INSULATION LAYER, MANUFACTURING METHOD FOR ARRAY SUBSTRATE AND ARRAY SUBSTRATE

BACKGROUND OF THE INVENTION

1. Field of the Invention

The present invention relates to a panel manufacturing field, and more particularly to a manufacturing method for insulation layer, a manufacturing method for array substrate and an array substrate.

2. Description of Related Art

The liquid crystal panel as a mainstream display panel has been widely applied in people's daily life and work. The liquid crystal panel usually performs a circuit control through an array substrate in order to realize a display. The array substrate usually adopts an organic insulation layer, and the organic insulation layer can decrease the parasitic capacitance between the metal electrodes in order to decrease the power consumption of the panel. The organic insulation layer can also make each film layer to be flatter in order to improve a dark status of the panel so as to improve a display contrast.

The manufacturing for the organic insulation layer is a necessary process of an array substrate. In the conventional manufacturing process, a serious deformation of an opening formed on the insulation layer is usually generated such that the opening is blocked, a resolution of the insulation layer is decreased.

SUMMARY OF THE INVENTION

The purpose of the present invention is to provide a manufacturing method for insulation layer, a manufacturing method for an array substrate and an array substrate in order to solve the situation of the deformation of the opening of the insulation layer in the conventional manufacturing process.

In order to solve the above problem, the present invention provides a manufacturing method for insulation layer, and the manufacturing method comprises following steps: depositing an insulation layer on a substrate; exposing and developing the insulation layer in order to obtain the insulation layer having an opening; light curing the insulation layer having the opening; and performing a high-temperature annealing treatment to the insulation layer having the opening after being light cured Wherein, the step of light curing the insulation layer having the opening comprises: adopting an ultraviolet light to light curing the insulation layer having the opening.

Wherein, after the step of depositing an insulation layer on a substrate comprises a step of: placing the substrate having the insulation layer in a vacuum for a period of time.

Wherein, after the step of depositing an insulation layer on a substrate comprises a step of: performing a baking treatment to the insulation layer.

Wherein, the step of depositing an insulation layer on a substrate comprises a step of: using a chemical vapor deposition to obtain the insulation layer.

In order to solve the above problem, the present invention also provides a manufacturing method for an array substrate, wherein, a step of forming an insulation layer is provided between steps of forming a data line and a common electrode line, and the step of forming the insulation layer comprises: depositing an insulation layer on a substrate; exposing and developing the insulation layer in order to obtain the insulation layer having an opening; light curing the insulation layer having the opening; and performing a high-temperature annealing treatment to the insulation layer having the opening after being light cured.

Wherein, the step of light curing the insulation layer having the opening comprises: adopting an ultraviolet light to light curing the insulation layer having the opening.

Wherein, after the step of depositing an insulation layer on a substrate comprises a step of: placing the substrate having the insulation layer in a vacuum for a period of time.

Wherein, after the step of depositing an insulation layer on a substrate comprises a step of: performing a baking treatment to the insulation layer.

Wherein, the step of depositing an insulation layer on a substrate comprises a step of: using a chemical vapor deposition to obtain the insulation layer.

In order to solve the above problem, the present invention also provides an array substrate, wherein the array substrate is manufactured by a manufacturing method, and the manufacturing method comprises: a step of forming an insulation layer is provided between steps of forming a data line and a common electrode line, and the step of forming the insulation layer comprises: depositing an insulation layer on a substrate; exposing and developing the insulation layer in order to obtain the insulation layer having an opening; light curing the insulation layer having the opening; and performing a high-temperature annealing treatment to the insulation layer having the opening after being light cured.

Wherein, the step of light curing the insulation layer having the opening comprises: adopting an ultraviolet light to light curing the insulation layer having the opening.

Wherein, after the step of depositing an insulation layer on a substrate comprises a step of: placing the substrate having the insulation layer in a vacuum for a period of time.

Wherein, after the step of depositing an insulation layer on a substrate comprises a step of: performing a baking treatment to the insulation layer.

Wherein, the step of depositing an insulation layer on a substrate comprises a step of: using a chemical vapor deposition to obtain the insulation layer.

The manufacturing method for insulation layer of the present invention comprises steps of: depositing an insulation layer on a substrate; exposing and developing the insulation layer in order to obtain the insulation layer having an opening; light curing the insulation layer having the opening; and performing a high-temperature annealing treatment to the insulation layer having the opening after being light cured. After the insulation layer is exposed and developed to obtain the opening, light curing the insulation layer such that the insulation layer generates a crosslinking reaction. When the crosslinking degree of the insulation layer is higher, when performing the high-temperature annealing treatment, a flow and deformation is not easily to generate in order to reduce the clog problem of the opening when performing the high-temperature annealing treatment.

DETAILED DESCRIPTION OF THE PREFERRED EMBODIMENT

In order to let the person skilled in the present field to understand the technology solution of the present invention better, the following content will combine the figures and the specific embodiments to illustrate a manufacturing method for insulation layer, a manufacturing method for array substrate and an array substrate in detail.

Figure 1:
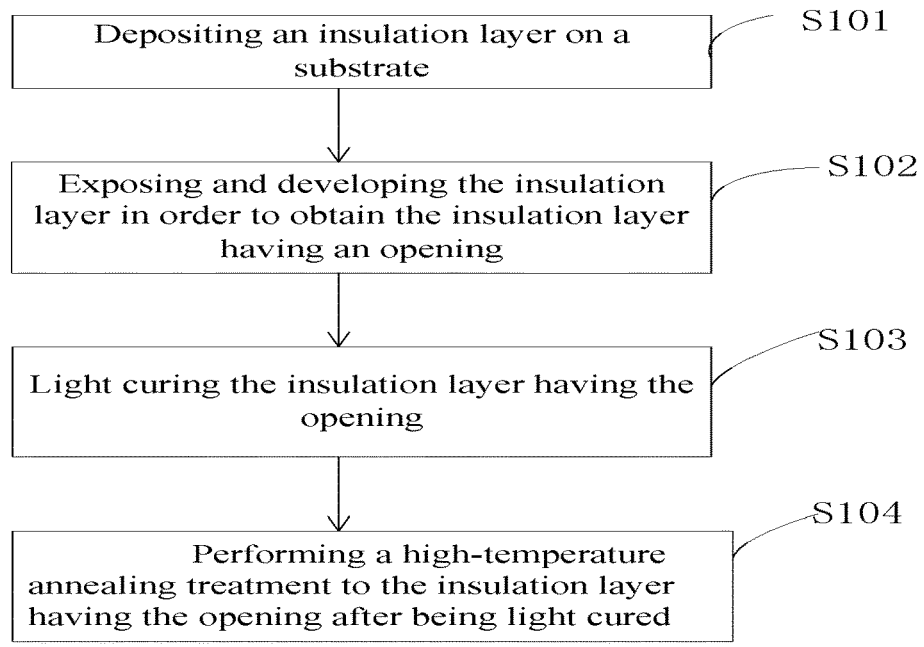
FIG. 1 is a flow chart of a manufacturing method for insulation layer of an embodiment of the present invention.
Figure 2:
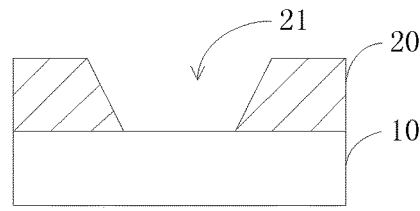
FIG. 2 is a schematic diagram of an insulation layer of the manufacturing method for insulation layer of an embodiment of the present invention.

With reference to FIG. 1 and FIG. 2, and FIG. 1 is a flow chart of a manufacturing method for insulation layer of an embodiment of the present invention, FIG. 2 is a schematic diagram of an insulation layer of the manufacturing method for insulation layer of an embodiment of the present invention.

The manufacturing method for insulation layer of the present embodiment includes following steps:

S101: depositing an insulation layer on a substrate.

The manufacturing of the insulation layer 20 of the present embodiment is a process in the manufacturing of an array substrate. In the present step, the substrate 10 does not mean a single layer of the array substrate, but is a generalized concept of a glass substrate or a metal layer, etc. The insulation layer 20 in the present step is formed on the substrate 10 by a chemical vapor deposition.

The chemical vapor deposition generally includes a solvent evaporation step, in the present embodiment, the substrate 10 being deposited with the insulation layer 20 is placed in a vacuum for a period of time in order to accelerate the evaporation of solvent. Furthermore, a baking treatment may be performed to the insulation layer 20.

S102: exposing and developing the insulation layer in order to obtain the insulation layer having an opening.

Adopting a mask to perform exposing and developing to the insulation layer 20 in order to obtain the insulation layer 20 having the opening 21. In the present embodiment, the insulation layer 20 is a negative type. That is, a mask that blocks the opening 21 is adopted to realize exposing and developing. The opening 21 that is not irradiated by the light is etched. The other portion that is irradiated by the light can generate a slight crosslinking reaction.

S103: light curing the insulation layer having the opening.

In the step S103, adopting an ultraviolet light to light cure the insulation layer 20 such that the insulation layer 20 having the opening 21 further generates a crosslinking reaction, the insulation layer 20 can be further cured without generating deformation and flow.

S104: performing a high-temperature annealing treatment to the insulation layer having the opening after being light cured.

The high-temperature annealing treatment in the step S104 can make the insulation layer 20 to be fully crosslinked. Besides, because in the step S103, the insulation layer 20 has been cured in a certain degree, the high temperature in the step S104 only has a smaller affection to the insulation layer such that the deformation and the reflow of the material of the insulation layer at the opening 21 is slight in order to reduce the clog problem of the opening 21.

The manufacturing method for insulation layer of the present invention comprises steps of: depositing an insulation layer on a substrate; exposing and developing the insulation layer in order to obtain the insulation layer having an opening; light curing the insulation layer having the opening; and performing a high-temperature annealing treatment to the insulation layer having the opening after being light cured. After the insulation layer is exposed and developed to obtain the opening, light curing the insulation layer such that the insulation layer generates a crosslinking reaction. When the crosslinking degree of the insulation layer is higher, when performing the high-temperature annealing treatment, a flow and deformation is not easily to generate in order to reduce the clog problem of the opening when performing the high-temperature annealing treatment.

Figure 3:
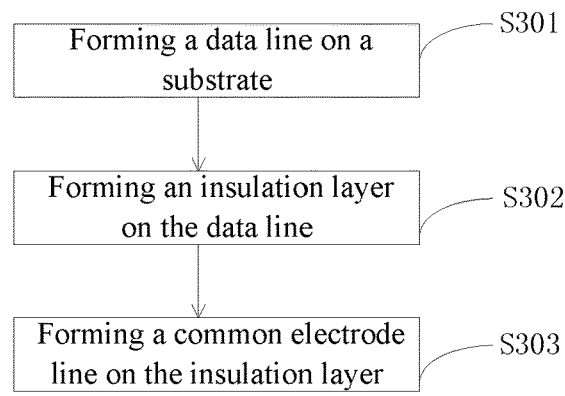
FIG. 3 is a flow chart of a manufacturing method for array substrate of an embodiment of the present invention.
Figure 4:
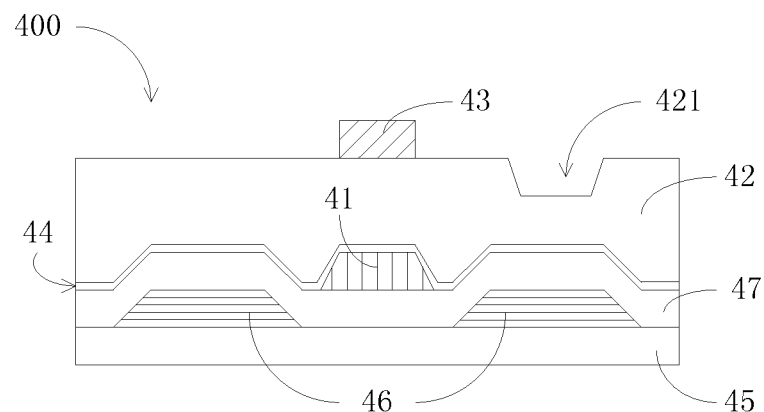
FIG. 4 is a schematic diagram of an array substrate of the manufacturing method for array substrate of an embodiment of the present invention.

With reference to FIG. 3 and FIG. 4, and FIG. 3 is a flow chart of a manufacturing method for array substrate of an embodiment of the present invention, and FIG. 4 is a schematic diagram of an array substrate of the manufacturing method for array substrate of an embodiment of the present invention.

The manufacturing method of the array substrate of the present embodiment includes following steps.

S301: forming a data line on a substrate.

S302: forming an insulation layer on the data line.

S303: forming a common electrode line on the insulation layer.

The insulation layer 42 in the array substrate 400 obtained in the present embodiment is formed between the data line 41 and the common electrode 43. The formation sequence of the data line 41 and the common electrode 43 is not limited. That is, the step S301 and the step S303 in the present embodiment can be exchanged. Forming the common electrode 43 firstly, then, forming the insulation layer 42. Finally, forming the data line 41. The specific way adopted can be determined according to the structure of the array substrate.

In the present embodiment, between the data line and the insulation layer, a passivation layer 44 made of silicon nitride ($SiN_x$) is provided. Before forming the data line in the step S301, the method further includes a step: forming a gate electrode layer 46 and a gate insulation layer 47 on a glass substrate 45.

Wherein, the step S302 is forming the insulation layer 42, and specifically includes steps of: 1) depositing an insulation layer on a substrate, placing the substrate having the insulation layer in a vacuum for a period of time, and performing a baking treatment to the insulation layer; 2) exposing and developing the insulation layer in order to obtain the insulation layer 42 having an opening 421; 3) adopting an ultraviolet light to light curing the insulation layer 42 having the opening 421; 4) performing a high-temperature annealing treatment to the insulation layer 42 having the opening 421 after being light cured. The present step S302 is similar to the manufacturing method for insulation layer of the above embodiment, no more repeating.

The insulation layer in the array substrate obtained through the manufacturing method for array substrate is light cured before the high-temperature annealing treatment and after exposing and developing such that the deformation degree in the high-temperature annealing treatment is smaller. The quality of the opening of the array substrate is higher, and correspondingly, the quality of the array substrate is higher.

Figure 5:
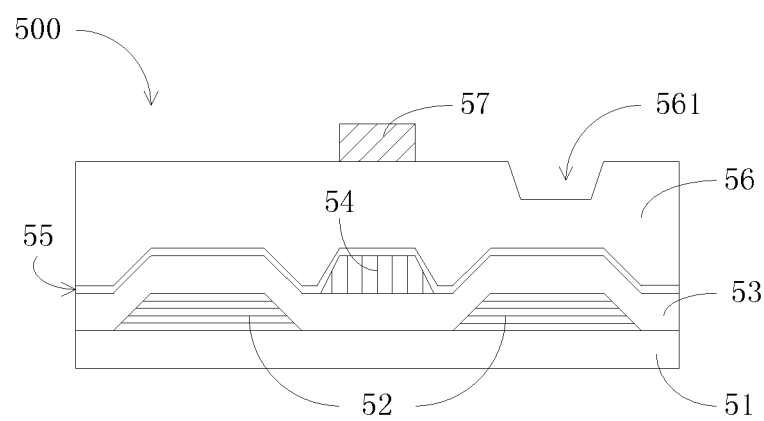
FIG. 5 is a schematic diagram of an array substrate of an embodiment of the present invention.

With reference to FIG. 5, and FIG. 5 is a schematic diagram of an array substrate of an embodiment of the present invention.

The array substrate 500 of the present embodiment is obtained by the manufacturing method for array substrate of the above embodiment.

Specifically, the array substrate 500 of the present embodiment includes a glass substrate 51, a gate electrode layer 52, a gate insulation layer 53, a data line 54, a passivation layer 55, an insulation layer 56 and a common electrode 57 which are sequentially formed on the glass substrate 51. Wherein, after the insulation layer 56 obtains the opening 561 by exposing and developing, further performing a light curing treatment. Then, performing a high-temperature annealing treatment.

In another embodiment, the location relationship of the gate electrode layer 52, the data line 54 and the common electrode 57 can be determined according to the type of the array substrate 500. For example, in some array substrate, the gate electrode layer 52 and the common electrode 57 are disposed at a same layer. Therefore, the location relationship of the gate electrode layer 52, the data line 54 and the common electrode 57 is not limited in the present invention.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method of an insulation layer, wherein the manufacturing method comprises:
   depositing the insulation layer on a substrate;
   exposing and developing the insulation layer in order to obtain an opening in the insulation layer;
   light curing the insulation layer; and
   performing a high-temperature annealing treatment to the insulation layer after the insulation layer being light cured;
   wherein after depositing the insulation layer on the substrate and before exposing and developing the insulation layer, the method further comprises:
   placing the substrate deposited with the insulation layer in a vacuum for a period of time.

2. The manufacturing method according to claim 1, wherein the step of light curing the insulation layer comprises:
   adopting ultraviolet light to light cure the insulation layer.

3. The manufacturing method according to claim 1, wherein after the step of depositing the insulation layer on the substrate comprises:
   placing the substrate in a vacuum for a period of time.

4. The manufacturing method according to claim 1, wherein after the step of depositing the insulation layer on the substrate comprises:
   performing a baking treatment to the insulation layer.

5. The manufacturing method according to claim 1, wherein the step of depositing the insulation layer on the substrate comprises: using chemical vapor deposition to obtain the insulation layer.

6. A manufacturing method for an array substrate, comprising:
   depositing an insulation layer on a substrate of the array substrate;
   exposing and developing the insulation layer in order to obtain an opening in the insulation layer;
   light curing the insulation layer; and
   performing a high-temperature annealing treatment to the insulation layer after the insulation layer being light cured;
   wherein the insulation layer is disposed between g data line and g common electrode line of the array substrate; and
   wherein the insulation layer is disposed above a gate electrode layer, a gate insulation layer and a passivation layer, wherein the gate electrode layer is directly located on the substrate, the passivation layer is directly disposed on and completely covers the data line and the common electrode is disposed on the insulation layer;
   wherein after depositing the insulation layer on the substrate and before exposing and developing the insulation layer, the method further comprises:
   placing the substrate deposited with the insulation layer in a vacuum for a period of time.

7. The manufacturing method according to claim 6, wherein the step of light curing the insulation comprises:
   adopting ultraviolet light to light cure the insulation layer.

8. The manufacturing method according to claim 6, wherein after the step of depositing the insulation layer on the substrate comprises:
   placing the substrate in a vacuum for a period of time.

9. The manufacturing method according to claim 6, wherein after the step of depositing the insulation layer on the substrate comprises:
   performing a baking treatment to the insulation layer.

10. The manufacturing method according to claim 6, wherein the step of depositing the insulation layer on the substrate comprises: using chemical vapor deposition to obtain the insulation layer.

* * * * *